United States Patent
Mori et al.

(10) Patent No.: US 12,386,736 B2
(45) Date of Patent: Aug. 12, 2025

(54) MEMORY SYSTEM AND METHOD FOR CONTROLLING THE SAME

(71) Applicant: Kioxia Corporation, Tokyo (JP)

(72) Inventors: Haruka Mori, Kawasaki Kanagawa (JP); Mitsunori Tadokoro, Fujisawa Kanagawa (JP); Akinori Nagaoka, Tokyo (JP)

(73) Assignee: Kioxia Corporation, Tokyo (JP)

( * ) Notice: Subject to any disclaimer, the term of this patent is extended or adjusted under 35 U.S.C. 154(b) by 168 days.

(21) Appl. No.: 18/461,374

(22) Filed: Sep. 5, 2023

(65) Prior Publication Data

US 2024/0202111 A1   Jun. 20, 2024

(30) Foreign Application Priority Data

Dec. 20, 2022 (JP) ................. 2022-203666

(51) Int. Cl.
*G11C 29/50* (2006.01)
*G06F 12/02* (2006.01)
*G11C 29/52* (2006.01)

(52) U.S. Cl.
CPC .......... *G06F 12/0238* (2013.01); *G11C 29/52* (2013.01)

(58) Field of Classification Search
CPC ... G11C 29/52; G11C 29/028; G06F 12/0238; G06F 2212/1008; G06F 2212/1016; G06F 2212/7206; G06F 2212/7201
See application file for complete search history.

(56) References Cited

U.S. PATENT DOCUMENTS

| | | | |
|---|---|---|---|
| 8,467,249 B2 * | 6/2013 | Katz | G11C 16/26 365/185.24 |
| 9,465,538 B2 | 10/2016 | Lai | |
| 11,221,915 B2 | 1/2022 | Gim | |
| 11,385,802 B2 | 7/2022 | Sharon | |
| 2013/0077400 A1 * | 3/2013 | Sakurada | G11C 16/06 365/185.03 |
| 2015/0287453 A1 * | 10/2015 | Wu | G11C 16/3418 365/185.12 |
| 2023/0087010 A1 * | 3/2023 | Yamada | G06F 12/0238 711/154 |

* cited by examiner

Primary Examiner — Uyen Smet
(74) Attorney, Agent, or Firm — Kim & Stewart LLP

(57) ABSTRACT

According to one embodiment, a controller for a memory system including a nonvolatile memory with physical blocks sets logical blocks including the physical blocks, manages a first table having a first value indicating a threshold voltage to be used for reading data from each logical block, a second table for each physical block having a corrected threshold voltage that has been statistically determined to be an outlier in association with a second value indicating the corrected threshold voltage for the physical block. The controller performs a threshold voltage tracking for identifying a threshold voltage suitable for reading data from a physical block if a reading fails, and then retries the reading using the threshold voltage obtained by the threshold voltage tracking. The controller updates the first table if the physical block is not listed in the second table, but not otherwise.

20 Claims, 13 Drawing Sheets

MEMORY SYSTEM AND METHOD FOR CONTROLLING THE SAME

CROSS-REFERENCE TO RELATED APPLICATION

This application is based upon and claims the benefit of priority from Japanese Patent Application No. 2022-203666, filed Dec. 20, 2022, the entire contents of which are incorporated herein by reference.

FIELD

Embodiments described herein relate generally to a memory system and a method for controlling the same.

BACKGROUND

A solid-state drive (SSD) has a NAND flash memory (flash memory). In an SSD, when reading data from the flash memory, threshold voltage tracking can be performed to search for an appropriate threshold voltage if necessary. The threshold voltage is used when converting the amount of charge held in the flash memory into binary data values. In other words, threshold voltage tracking is a process of searching for the threshold voltage for correctly reading data recorded in the flash memory. Storing and using the appropriate threshold voltage that is obtained by threshold voltage tracking is expected to prevent errors in reading from occurring.

BRIEF DESCRIPTION OF THE DRAWINGS

FIG. 14 is a flowchart for correcting a threshold voltage when a memory system according to a third embodiment is powered on.

DETAILED DESCRIPTION

In general, according to one embodiment, a memory system includes a nonvolatile memory and a controller. The nonvolatile memory comprises a plurality of physical blocks. The controller is configured to control reading and writing of the nonvolatile memory. The controller is further configured to: set a plurality of logical blocks, each including physical blocks; manage a first table including, for each logical block, a first value indicating a threshold voltage to be used for reading data from the logical block; manage a second table including, for each physical block having a corrected threshold voltage that is statistically determined to be an outlier from among corrected threshold voltages for each physical block, a second value indicating the corrected threshold voltage for the physical block together with an identifier of the physical block; perform a threshold voltage tracking for identifying a threshold voltage suitable for reading data from a first physical block if a reading of data from a first logical block including the first physical block fails, and then retry the reading of the data from the first logical block using the threshold voltage obtained by the threshold voltage tracking; update a threshold voltage for the first logical block including the first physical block in the first table to the threshold voltage obtained by the threshold voltage tracking if an identifier of the first physical block is not recorded in the second table; and prohibit updating of the threshold voltage for the first logical block in the first table to the threshold voltage obtained by the threshold voltage tracking if the identifier of the first physical block is recorded in the second table.

Hereinafter, certain example embodiments will be described with reference to the drawings.

First Embodiment

Figure 1:
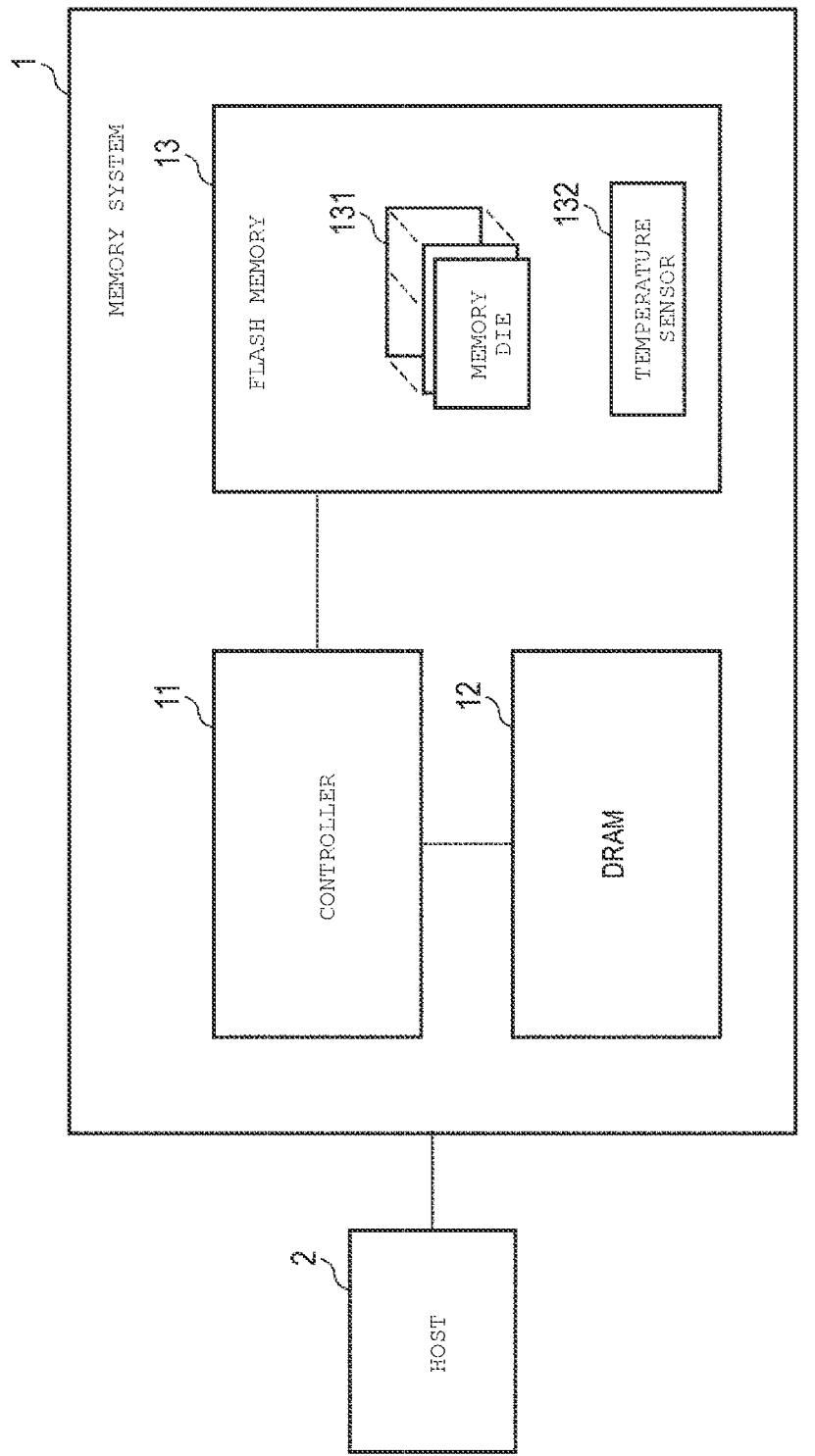
FIG. 1 is a diagram of an information processing system including a memory system according to a first embodiment.

FIG. 1 is a diagram showing a configuration example of an information processing system including a memory system 1 according to the first embodiment. Here, an example in which the memory system 1 is implemented as an SSD will be described. The memory system 1 is configured to be connectable to a host 2. The information processing system includes the memory system 1 and the host 2 connected to the memory system 1. The host 2 can be an information processing apparatus such as a server or a personal computer.

The memory system 1 includes a controller 11, a dynamic random access memory (DRAM) 12, and a NAND flash memory (hereinafter referred to as a flash memory) 13. The memory system 1 is connected to the host 2 via an interface conforming to PCI Express™ (PCIe™) specifications, for example.

The controller 11 is a device that controls the flash memory 13. The controller 11 controls a data write operation to the flash memory 13 and a data read operation from the flash memory 13 (while using the DRAM 12 as a work area) based on commands from the host 2, for example. The controller 11 communicates with the host 2 using a protocol conforming to NVM Express™ (NVMe™) specifications, for example. The controller 11 may be configured as a semiconductor integrated circuit such as a system on a chip (SoC).

The DRAM 12 is a volatile storage device. Here, an example in which the memory system 1 includes the DRAM 12 as a device that provides a work area to the controller 11 is shown. In other examples, controller 11 may incorporate a static RAM (SRAM), and this SRAM may be used as a work area. In other words, as one configuration example of the memory system 1, a configuration without the DRAM 12 is also conceivable.

The flash memory 13 is a nonvolatile storage device. The flash memory 13 includes a plurality of memory dies 131 and a temperature sensor 132. The temperature sensor 132 is a device that detects the temperature of the flash memory 13 and outputs a result of detection as temperature data. One temperature sensor 132 can be provided for each memory die 131 or one temperature sensor 132 can be provided for a plurality of memory dies 131.

A group of memory dies 131 among the plurality of memory dies 131 functions as a unit of parallel operation of the flash memory 13. The controller 11 selects individual physical blocks one by one from the group of memory dies 131 functioning as a unit of parallel operation of the flash memory 13, and constitutes (sets) a logical block including a predetermined number of selected physical blocks. A logical block is an expansive management unit allowing the controller 11 to efficiently use the area of the flash memory 13. A logical block is also sometimes called a block group or a superblock.

Figure 2:
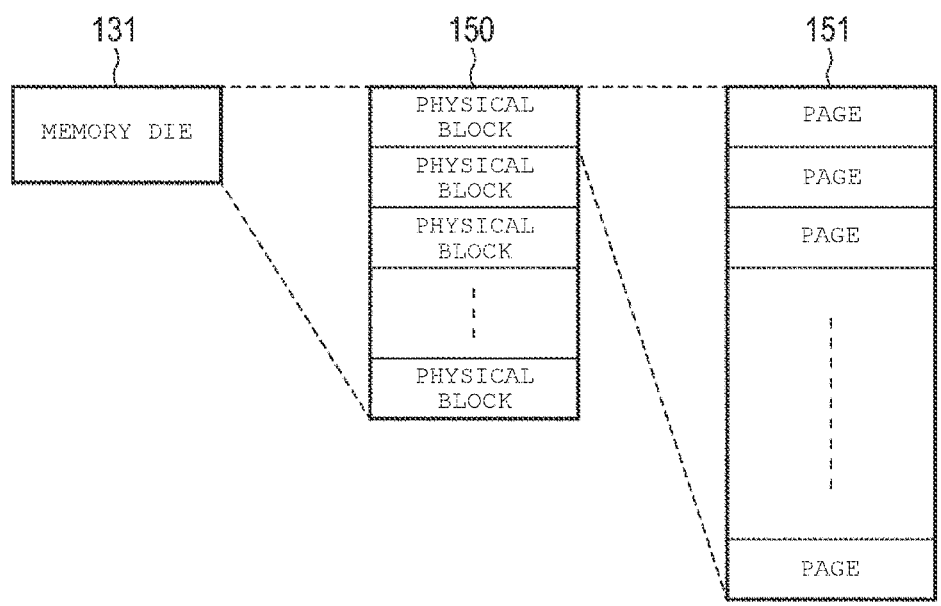
FIG. 2 is a diagram of a memory die of a memory system according to a first embodiment.

FIG. 2 is a diagram showing a configuration example of the memory die 131.

Each memory die 131 includes a plurality of physical blocks 150. Each of the physical blocks 150 includes a plurality of pages 151. Data writing and reading with respect to the memory die 131 are performed in units of the size of a page 151 (page units).

Figure 3:
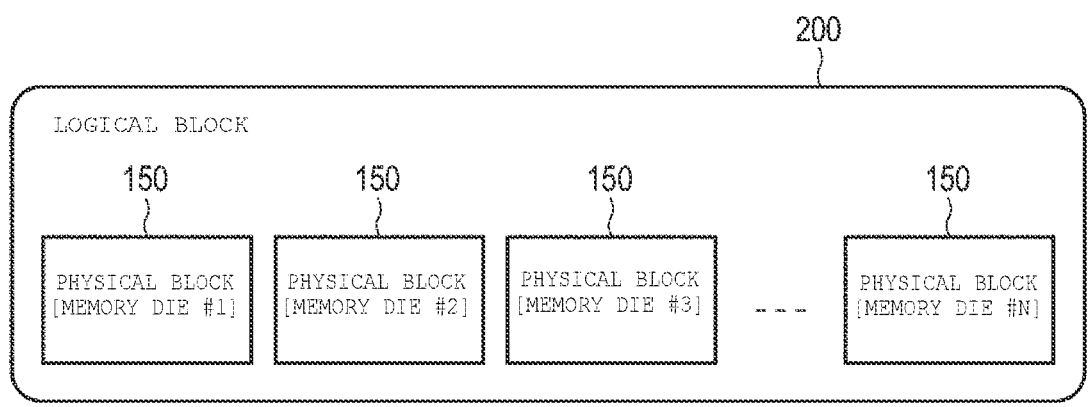
FIG. 3 is a diagram of logical blocks of a memory system according to a first embodiment.

FIG. 3 is a diagram showing a conceptual configuration example of a logical block 200.

As an example, a case where N (N is a natural number equal to or greater than 2) memory dies 131 function as units of parallel operation 13 will be described. In this case, the controller 11 selects physical blocks 150 one by one from the N memory dies 131 and forms a logical block 200 including the selected N physical blocks 150. Since the N memory dies 131 provided in the logical block 200 are all capable of parallel operation, data writing to the logical block 200 may be performed by N pages simultaneously, for example.

Figure 4:
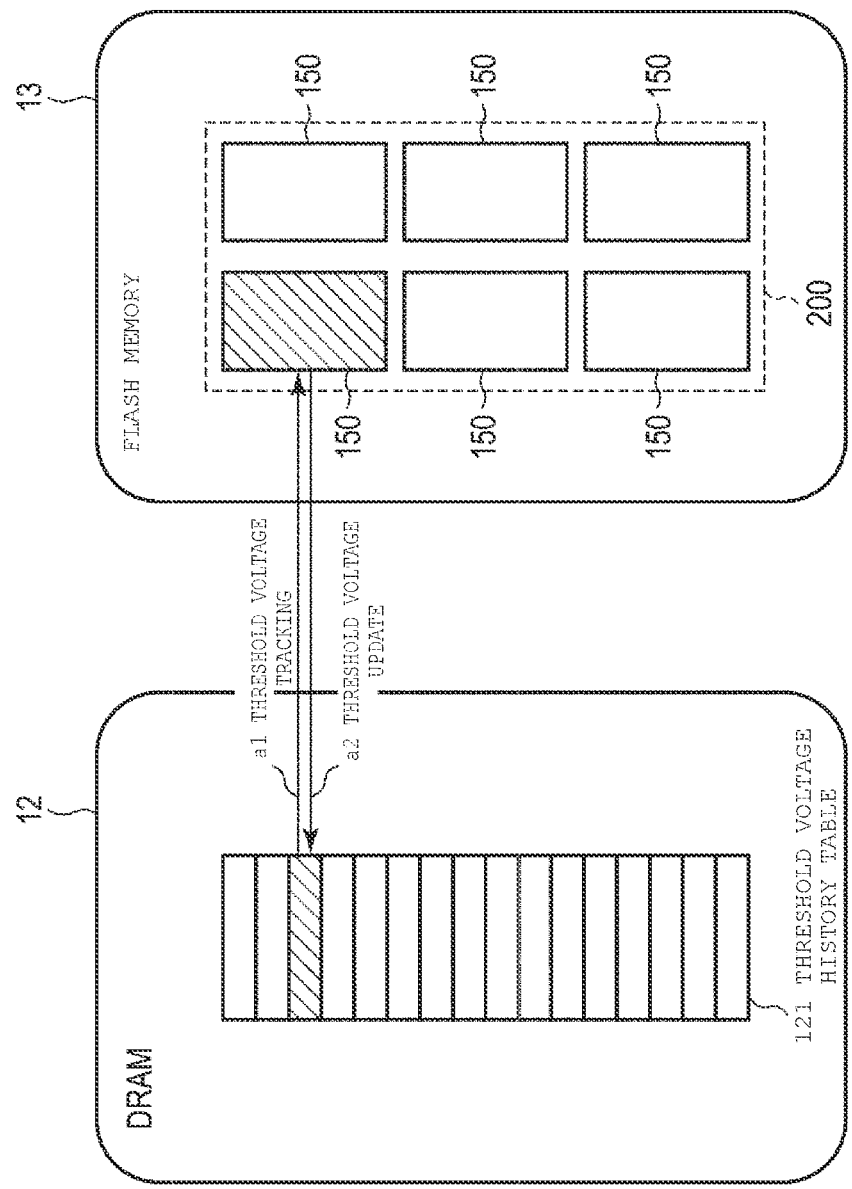
FIG. 4 is a diagram illustrating a first comparative example related to threshold voltage correction.

Next, a first comparative example related to threshold voltage correction will be described with reference to FIG. 4. This first comparative example is an example in which the controller 11 corrects a threshold voltage using a method of the related art. The process of correction of the threshold voltage is also referred to as threshold correction.

When an error occurs at the time of reading data from the flash memory 13, the controller 11 performs threshold voltage tracking (a1) for searching for an appropriate threshold voltage for the physical block 150 storing the data. It should be noted that the occurrence of an error here means that an error is detected in the read data by an error correcting code process and the error cannot be corrected by the error correcting code process.

The controller 11 sets the threshold voltage obtained by threshold voltage tracking, and retries reading from the flash memory 13 for the data in which the error occurred. The controller 11 also constructs a threshold voltage history table 121 in the DRAM 12 and records values based on threshold voltages obtained by threshold voltage tracking in the threshold voltage history table 121. In other words, the controller 11 updates the threshold voltage history table 121 based on the threshold voltages obtained by threshold voltage tracking. In order to reduce the size of the threshold voltage history table 121, the controller 11 constructs a threshold voltage history table 121 in which each entry corresponds to one logical block.

In other words, when the data read from a certain physical block 150 contains an error that cannot be corrected by the error correcting code process, the controller 11 updates (a2) a threshold voltage for the logical block 200 including the physical block 150 in the threshold voltage history table 121 based on the threshold voltage obtained by threshold voltage tracking for the physical block 150. Here, as a data structure for recording the threshold voltage for each logical block 200, a data structure in a table format is shown as an example, but the data structure is not limited thereto, and data structures in various formats can be applied. In the following description, data structures of all information and data with the name "table" are not limited to data structures in table formats, and data structures in various formats can be applied.

When reading data from the logical block 200 (more specifically, from a physical block 150 provided in the logical block 200) whose threshold voltage has been recorded in the threshold voltage history table 121, the controller 11 can prevent additional errors from occurring by using the threshold voltage previously recorded in the threshold voltage history table 121.

At the start of use of the memory system 1, the threshold voltage history table 121 is empty, with no threshold voltage recorded entries. Thereafter, as the use of the memory system 1 progresses and, for example, the flash memory 13 begins to change over time, the appropriate threshold voltage for each physical block 150 may shift. As a result, the number of physical blocks 150 in which an error occurs at the time of reading data increases, and the need for performing threshold voltage tracking increase accordingly. Each time the controller 11 performs threshold voltage tracking on a certain physical block 150, the controller 11 records the threshold voltage (obtained by the threshold voltage tracking) for the logical block 200 including the physical block 150 in the threshold voltage history table 121. As a result, a threshold voltage for each logical block 200 may be gradually recorded in the threshold voltage history table 121.

Furthermore, even when the threshold voltage recorded in the threshold voltage history table 121 is used, if a certain amount of time has elapsed since the threshold voltage was recorded in the threshold voltage history table 121, an error may occur in a read operation or the like. In that case, the controller 11 performs threshold voltage tracking again for the physical block 150 storing the data, and updates the threshold voltage recorded in the threshold voltage history table 121 based on the threshold voltage obtained by the threshold voltage tracking for the corresponding logical block 200. Accordingly, the memory system 1 in the first comparative example can follow and adjust for changes in the flash memory 13 over time.

The controller 11 may perform a nonvolatile storage of the threshold voltage history table 121 in the flash memory 13 when the memory system 1 is powered off, and then perform a loading of the threshold voltage history table 121 from the flash memory 13 to the DRAM 12 when the memory system 1 is powered on. Accordingly, the threshold voltage history table 121 constructed on the volatile RAM can be continuously used.

Incidentally, as described above, when an entry in the threshold voltage history table 121 is provided for each logical block 200 and the threshold voltage obtained by threshold voltage tracking is managed in units of logical blocks 200, if there is a memory die 131 of extremely poor quality, there is a possibility that the threshold correction for the logical block 200 including the physical block 150 selected from such a poor quality memory die 131 will perform poorly overall. In other words, there is a possibility that one heterogeneous physical block 150 among the N physical blocks 150 provided in the logical block 200 will adversely affect the other N−1 physical blocks 150 with respect to threshold correction.

Therefore, the memory system 1 according to the first embodiment has a mechanism for preventing the influence of some heterogeneous physical blocks 150 in the logical block 200 from affecting the entire logical block 200 with respect to threshold correction. This mechanism will be described in detail below.

Figure 5:
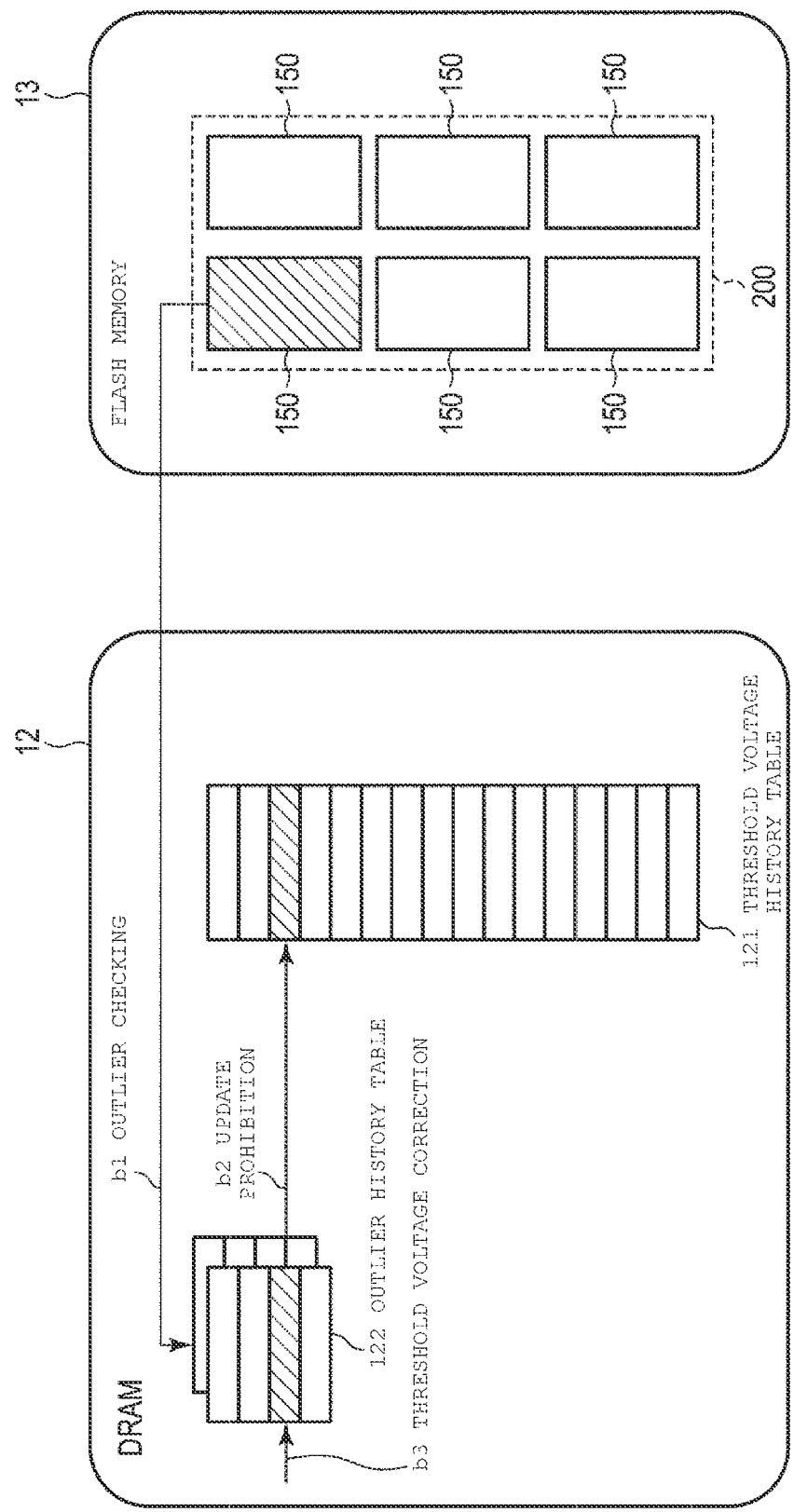
FIG. 5 is a diagram illustrating aspects related to threshold voltage correction in a memory system according to a first embodiment.

FIG. 5 is a diagram illustrating threshold correction of the memory system 1 according to the first embodiment.

The flash memory 13 stores a corrected threshold voltage unique to each physical block 150 at the time of manufacture. That is, a corrected voltage is separately provided for every one of the physical blocks 150. Each corrected threshold voltage is a correction value for the physical block 150 from a standard threshold voltage (for example, an initial value for the threshold voltage) nominally usable for all of the physical blocks 150. The controller 11 acquires these corrected threshold voltages for each physical block 150 and extracts those with particularly large variations. This extraction is a detection of outliers by, for example, a statistical method.

The controller 11 constructs an outlier history table 122 in the DRAM 12 and records the corrected threshold voltages extracted as the outliers in the outlier history table 122. The controller 11 records, in each entry of the outlier history table 122, an identifier of the physical block 150 from which the corrected threshold voltage was extracted as an outlier and the corrected threshold voltage for that physical block 150. In other words, the entries in the outlier history table 122 are on a per physical block 150 basis.

As described above, when an error occurs at the time of reading data from the flash memory 13, the controller 11 performs a threshold voltage tracking for searching for an appropriate threshold voltage for the physical block 150 storing the data. Then, the controller 11 uses the threshold voltage obtained by threshold voltage tracking, and retries reading from the flash memory 13 for the data in which the error occurred.

In the first comparative example, a value based on the threshold voltage obtained by threshold voltage tracking would be recorded in the threshold voltage history table 121 for the corresponding logical block 120. If a threshold voltage has already been recorded for that logical block, the controller 11 updates the threshold voltage to the new (updated) threshold voltage obtained by threshold voltage tracking.

In contrast, in the memory system 1 according to the first embodiment, the controller 11 refers to the outlier history table 122 (b1) before updating the threshold voltage history table 121, and determines whether an entry for the identifier of the physical block 150 for which threshold voltage tracking has just been performed exists. When the corresponding entry for the physical block 150 exists, the controller 11 prohibits updating (b2) of the threshold voltage history table 121 with the threshold voltage just obtained by threshold voltage tracking. Instead of updating the threshold voltage history table 121, the controller 11 updates the outlier history table 122 to reflect the threshold voltage obtained by threshold voltage tracking (b3).

When the corresponding entry does not exist, the controller 11 updates the threshold voltage history table 121 to the threshold voltage just obtained by threshold voltage tracking.

As with the threshold voltage history table 121, the controller 11 may perform a nonvolatile storage of the outlier history table 122 in the flash memory 13 when the memory system 1 is powered off, and perform a loading of the outlier history table 122 from the flash memory 13 to the DRAM 12 when the memory system 1 is powered on. Accordingly, the outlier history table 122 can be continuously used.

Thereby, the memory system 1 according to the first embodiment prevents the influence of some heterogeneous physical blocks 150 in the logical block 200 from affecting the entire logical block 200 with respect to threshold correction. In other words, in the memory system 1 according to the first embodiment, threshold voltage correction with high accuracy is achieved.

Figure 6:
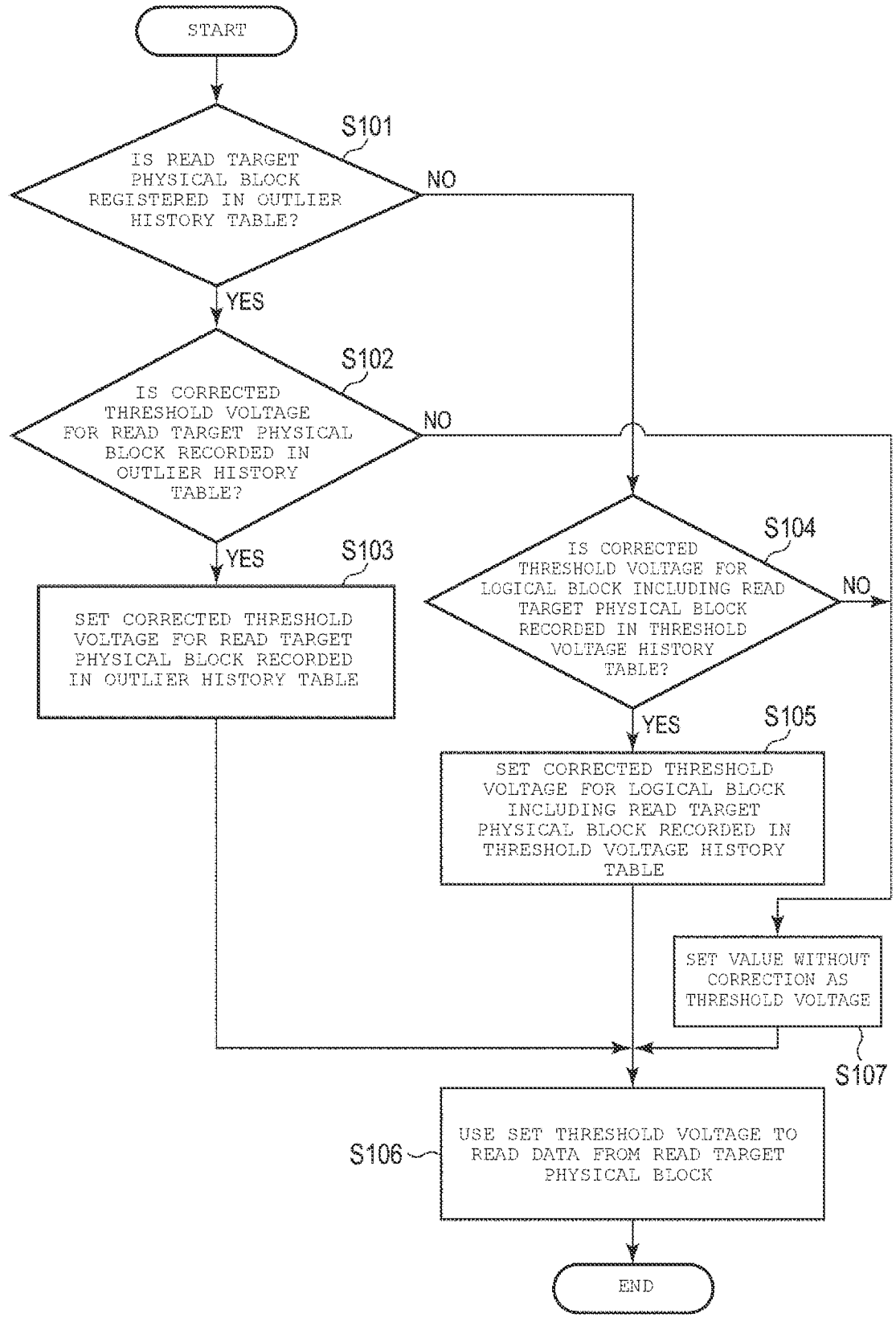
FIG. 6 is a flowchart for correcting a threshold voltage at the time of reading data from a flash memory in a memory system according to a first embodiment.

FIG. 6 is a flowchart showing a procedure for threshold correction at the time of reading data from the flash memory 13 of the memory system 1 according to the first embodiment.

The controller 11 first determines whether a read target physical block 150 is registered in the outlier history table 122 (S101). When it is registered (S101: YES), the controller 11 next determines whether a corrected threshold voltage for the read target physical block 150 is recorded in the outlier history table 122 (S102). When it is recorded (S102: YES), the controller 11 sets the corrected threshold voltage for the read target physical block 150 recorded in the outlier history table 122 (S103). Then, the controller 11 uses the set corrected threshold voltage (for example, a threshold voltage obtained by adding the set corrected threshold voltage to the standard threshold voltage) to read data from the read target physical block 150 (S106).

When the corrected threshold voltage for the read target physical block 150 is not recorded in the outlier history table 122 (S102: NO), the controller 11 sets a value without correction (for example, a standard threshold voltage value) as the threshold voltage (S107), and then uses the set corrected threshold voltage to read data from the read target physical block 150 (S106).

When the read target physical block 150 is not registered in the outlier history table 122 (S101: NO), the controller 11 next determines whether a corrected threshold voltage for the logical block 200 including the read target physical block 150 has been previously recorded in the threshold voltage history table 121 (S104). When it has been recorded (S104: YES), the controller 11 sets the corrected threshold voltage recorded in the threshold voltage history table 121 (S105) The controller 11 uses the set corrected threshold voltage (for example, a threshold voltage obtained by adding the set corrected threshold voltage to the standard threshold voltage) to read data from the read target physical block 150 (S106).

When a corrected threshold voltage is not recorded in the threshold voltage history table 121 (S104: NO), the controller 11 sets a value without correction (for example, a standard threshold voltage value) as the threshold voltage (S107), and uses the set threshold voltage to read data from the read target physical block 150 (S106).

Figure 7:
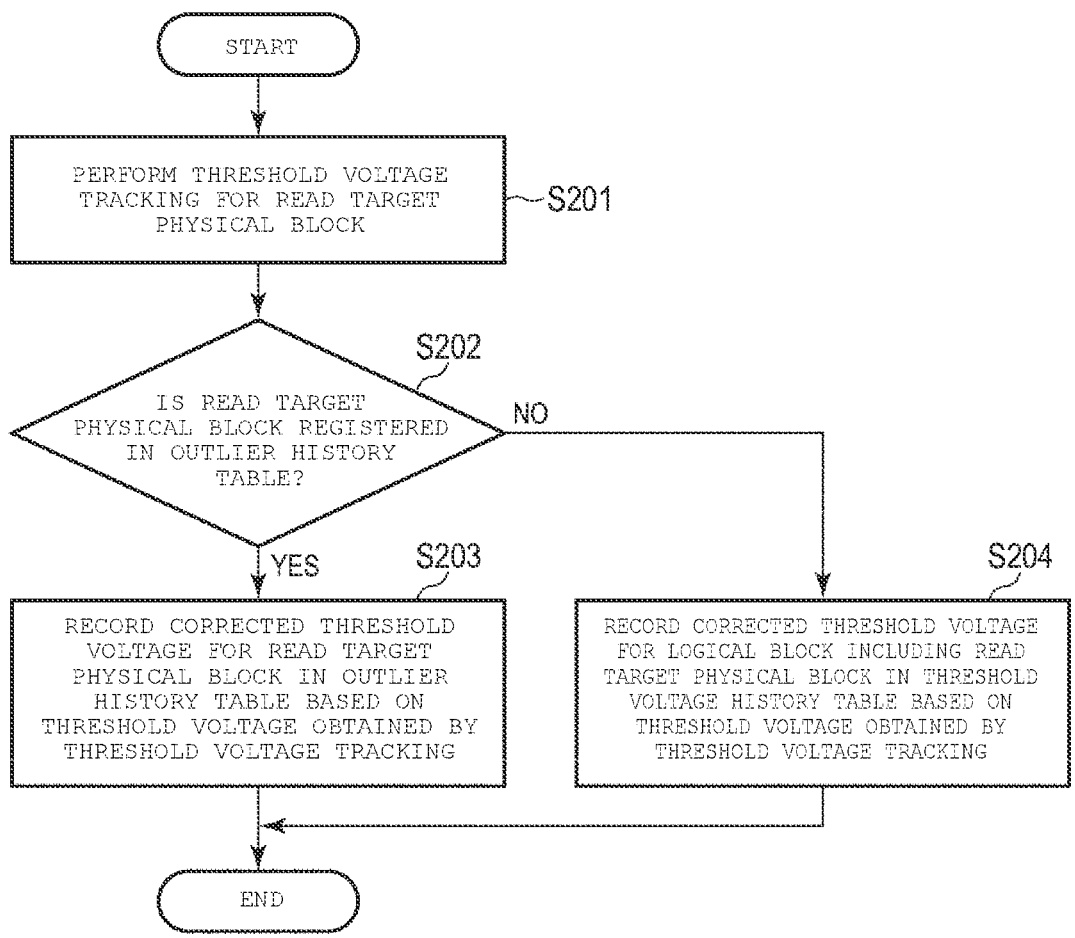
FIG. 7 is a flowchart for correcting a threshold voltage when an error occurs at the time of reading data from a flash memory in a memory system according to a first embodiment.

FIG. 7 is a flowchart showing a procedure for threshold correction when an error occurs at the time of reading data from the flash memory 13 of the memory system 1 according to the first embodiment.

The controller 11 performs threshold voltage tracking for the read target physical block 150 (S201). The controller 11 determines whether the read target physical block 150 is registered in the outlier history table 122 (S202). When it is registered (S202: YES), the controller 11 updates the corrected threshold voltage for the read target physical block 150 in the outlier history table 122 based on the threshold voltage obtained by threshold voltage tracking (S203).

When it is not registered in the outlier history table 122 (S202: NO), the controller 11 records the corrected threshold voltage for the logical block 200 including the read target physical block 150 in the threshold voltage history table 121 based on the threshold voltage obtained by the threshold voltage tracking (S204).

As described above, the memory system 1 according to the first embodiment can perform threshold voltage correction with high accuracy.

Second Embodiment

In the second embodiment, as in the first embodiment, a memory system 1 implemented as an SSD will be described as an example. The basic configuration of the memory system 1 is the same as that of the first embodiment.

Figure 8:
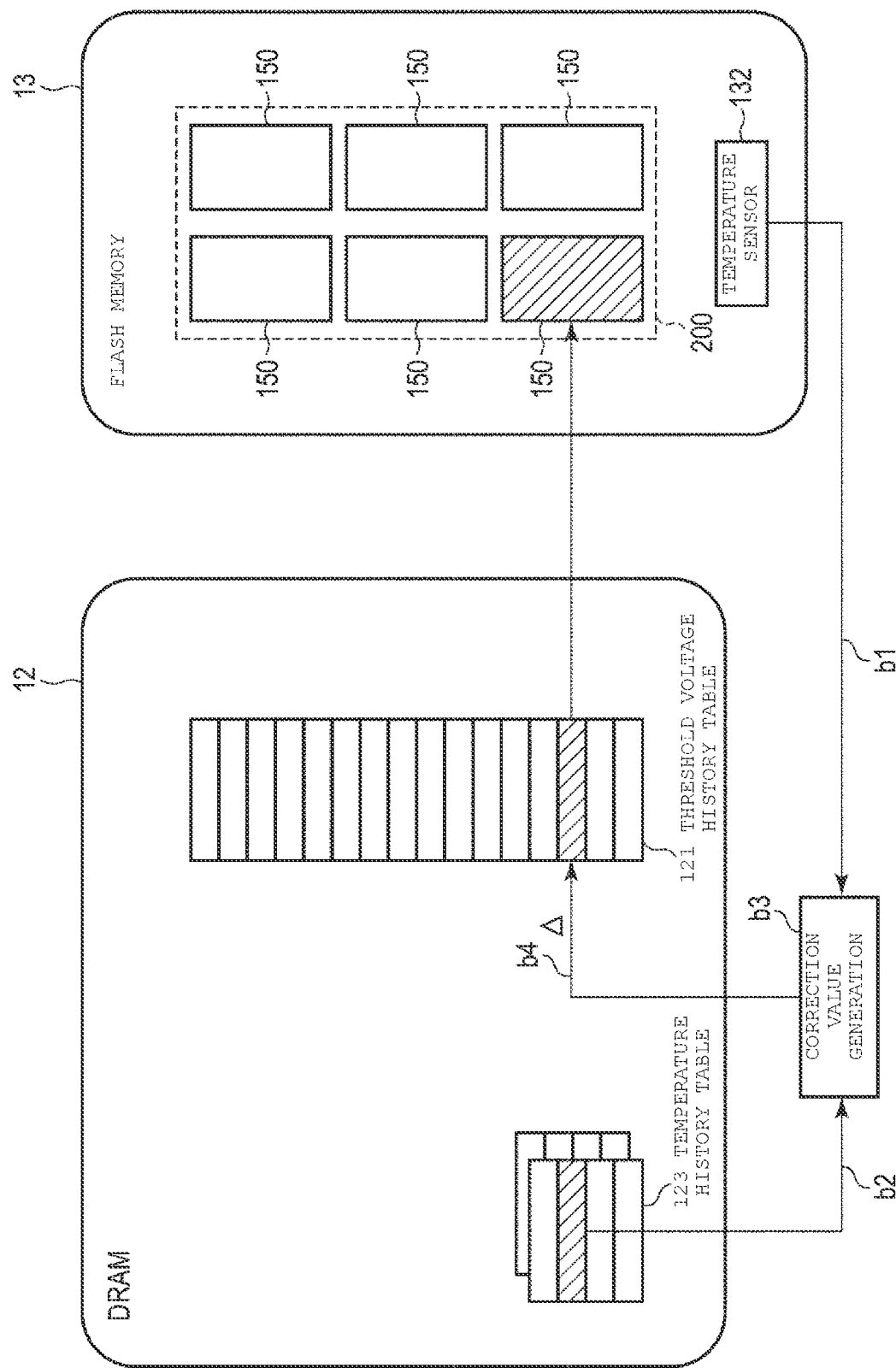
FIG. 8 is a diagram illustrating threshold voltage correction in a memory system according to a second embodiment.

In the memory system 1 according to the second embodiment, the controller 11 performs threshold correction in consideration of changes in the electrical characteristics of the flash memory 13 due to temperature variations. FIG. 8 is a diagram illustrating threshold correction of the memory system 1 according to the second embodiment.

In the memory system 1 according to the second embodiment, the controller 11 constructs a temperature history table 123 in the DRAM 12. This temperature history table 123 records temperature data for the flash memory 13 at the time of writing data to the flash memory 13 for units of logical blocks 200.

When reading data from a physical block 150 of the flash memory 13, the controller 11 acquires temperature data (b1) output from a temperature sensor 132 corresponding to the target physical block 150. Also, the controller 11 acquires the recorded temperature data (b2) from the temperature history table 123 for the logical block 200 including the read target physical block 150.

The controller 11 calculates a difference between a read temperature (based on the temperature data acquired from the temperature sensor 132) and a write temperature (based on the temperature data acquired from the temperature history table 123) and acquires a correction value A for the threshold voltage (b3) according to the calculated temperature difference between them. This correction value A may be acquired, for example, by referring to a correction table provided in advance or by calculation of a model function. The model function is obtained by modeling the relationship between the temperature difference and the correction value based on prior experiment, measurements, or the like.

The controller 11 corrects and sets the threshold voltage recorded in the threshold voltage history table 121 using the acquired correction value A (b4), and reads data from the read target physical block 150. In this example, the controller 11 does not update the threshold voltages recorded in the threshold voltage history table 121.

The controller 11 may perform a nonvolatile storage of the temperature history table 123 in the flash memory 13 when the memory system 1 is powered off, and perform a loading of the temperature history table 123 from the flash memory 13 to the DRAM 12 when the memory system 1 is powered on. Accordingly, the temperature history table 123 can be continuously used.

In this way, the memory system 1 according to the second embodiment performs threshold correction in consideration of expected changes in the electrical characteristics of the flash memory 13 due to temperature differences. More specifically, threshold correction is performed in consideration of the temperature difference between the temperature at the time of writing data to the flash memory 13 and the temperature at the time of reading data from the flash memory 13. In the memory system 1 according to the second embodiment, threshold voltage correction with high accuracy is achieved.

Figure 9:
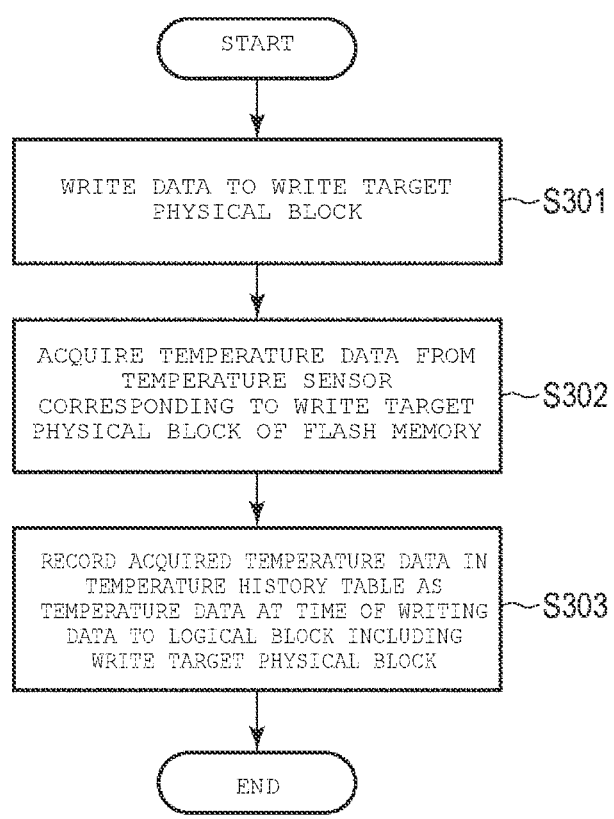
FIG. 9 is a flowchart for correcting a threshold voltage at the time of writing data to a flash memory in a memory system according to a second embodiment.

FIG. 9 is a flowchart showing a procedure for threshold correction at the time of writing data to the flash memory 13 of the memory system 1 according to the second embodiment.

The controller 11 writes data to a write target physical block 150 (S301). After executing data writing, the controller 11 acquires temperature data from the temperature sensor 132 of the flash memory 13 (S302). The controller 11 records the temperature data acquired from the temperature sensor 132 in the temperature history table 123 as the temperature data at the time of writing data to the logical block 200 including the write target physical block 150 (S303).

Figure 10:
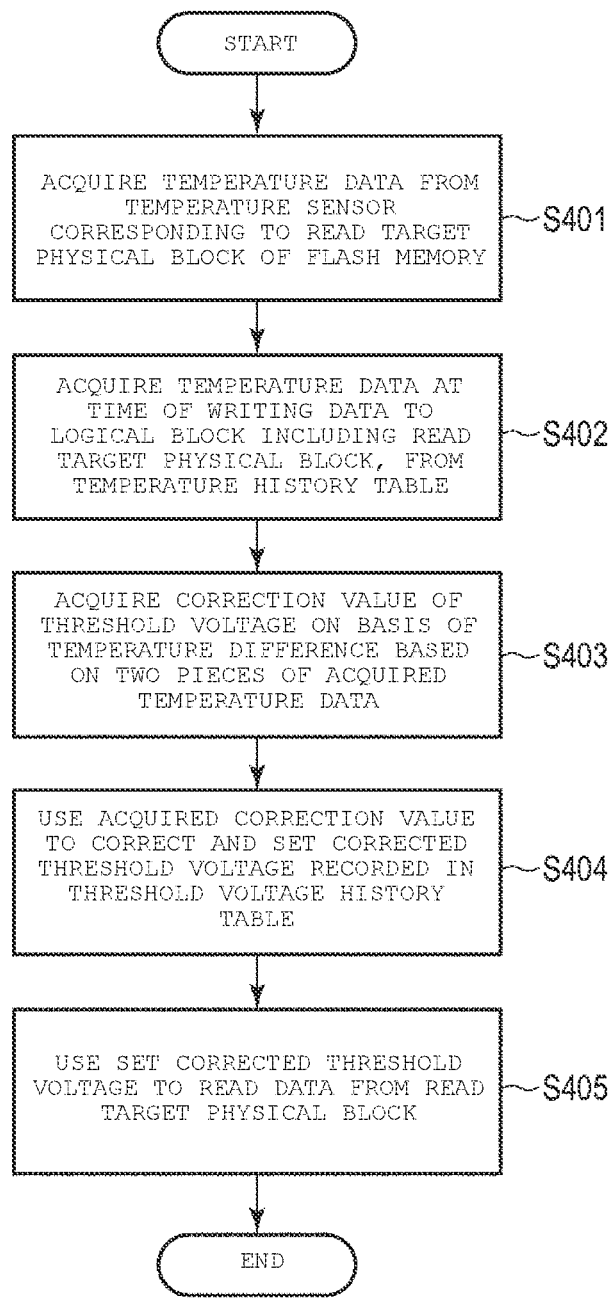
FIG. 10 is a flowchart for correcting a threshold voltage at the time of reading data from a flash memory in a memory system according to a second embodiment.

FIG. 10 is a flowchart showing a procedure for threshold correction at the time of reading data from the flash memory 13 of the memory system 1 according to the second embodiment.

The controller 11 acquires temperature data from the temperature sensor 132 corresponding to the read target physical block 150 of the flash memory 13 (S401). The controller 11 also acquires temperature data at the time of writing data to the logical block 200 including the read target physical block 150 from the temperature history table 123 (S402).

The controller 11 acquires a correction value of the threshold voltage on the basis of the temperature difference based on the two pieces of acquired temperature data (S403). The controller 11 uses the acquired correction value to correct and set the corrected threshold voltage recorded in the threshold voltage history table 121 (S404). The controller 11 uses the set threshold voltage to read data from the read target physical block 150 (S405).

It should be noted that, when an error occurs at the time of reading data, the controller 11 performs threshold voltage tracking on the read target physical block 150 as described above. The controller 11 records the corrected threshold voltage for the logical block 200 including the read target physical block 150 in the threshold voltage history table 121 based on the threshold voltage obtained by the threshold voltage tracking. At this time, in the memory system 1 according to the second embodiment, the controller 11 acquires a correction value A of the threshold voltage according to the temperature difference between the time of writing and the time of tracking, and records, in the threshold voltage history table 121, the corrected threshold voltage that should be applied when reading is performed with respect to the temperature at the time of writing data, taking into consideration the correction value A.

It should be noted that the threshold correction method for the memory system 1 described in the second embodiment can be applied in combination with the threshold correction method for the memory system 1 described in the first embodiment. According to the threshold correction method of the first embodiment, the influence of the heterogeneous physical block 150 on the threshold voltage history table 121 is reduced, and the change in the electrical characteristics of the flash memory 13 due to the temperature change can be mitigated by the threshold correction method of the second embodiment. Therefore, threshold voltage correction with higher accuracy is achieved.

Third Embodiment

In the third embodiment, as in the first embodiment, a memory system 1 implemented as an SSD will be described as an example. The basic configuration of the memory system 1 is the same as that of the first embodiment.

Figure 11:
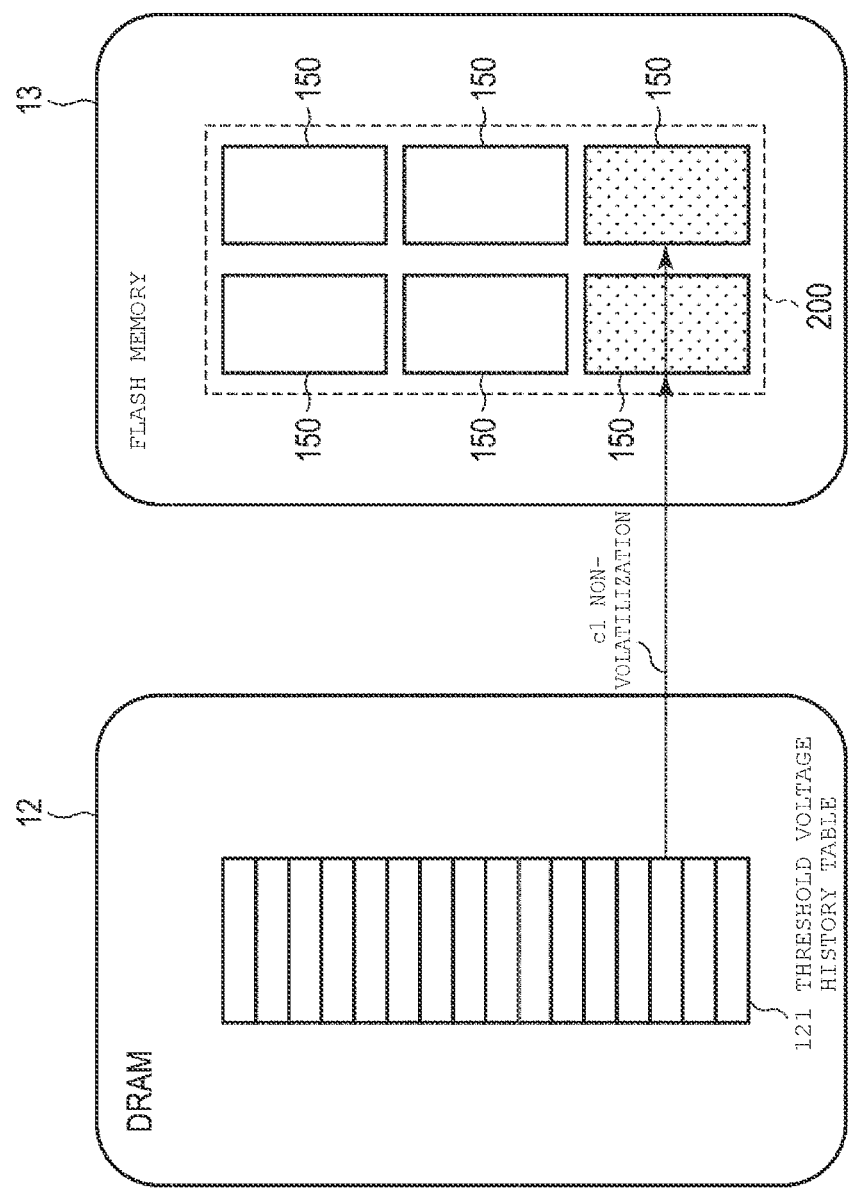
FIG. 11 is a diagram illustrating a second comparative example related to non-volatilization of a threshold voltage history table.

As described for the first embodiment, the controller 11 performs nonvolatile storage of the threshold voltage history table 121 in the flash memory 13 when the memory system 1 is powered off, and performs loading of the threshold voltage history table 121 from the flash memory 13 to the DRAM 12 when the memory system 1 is powered on. FIG. 11 is a diagram illustrating a second comparative example regarding non-volatilization of the threshold voltage history table 121. This second comparative example is an example in which the controller 11 makes the threshold voltage history table 121 nonvolatile using a method of the related art.

The controller 11 in this second comparative example stores the threshold voltage history table 121 into the flash memory 13 without compression to ensure the integrity of the threshold voltage history table 121 or with a low-efficiency lossless compression (c1). FIG. 11 shows a state in which the threshold voltage history table 121 has been non-volatilized using two physical blocks 150.

In contrast, in the memory system 1 according to the third embodiment, in order to reduce the "nonvolatile cost," that is, to reduce the consumption of the flash memory 13 by the non-volatilization (storage) of the threshold voltage history table 121 as much as possible, the controller 11 performs a highly efficient lossy compression such as Fast Fourier Transform (FFT) and stores the compressed table in the flash memory 13.

Figure 12:
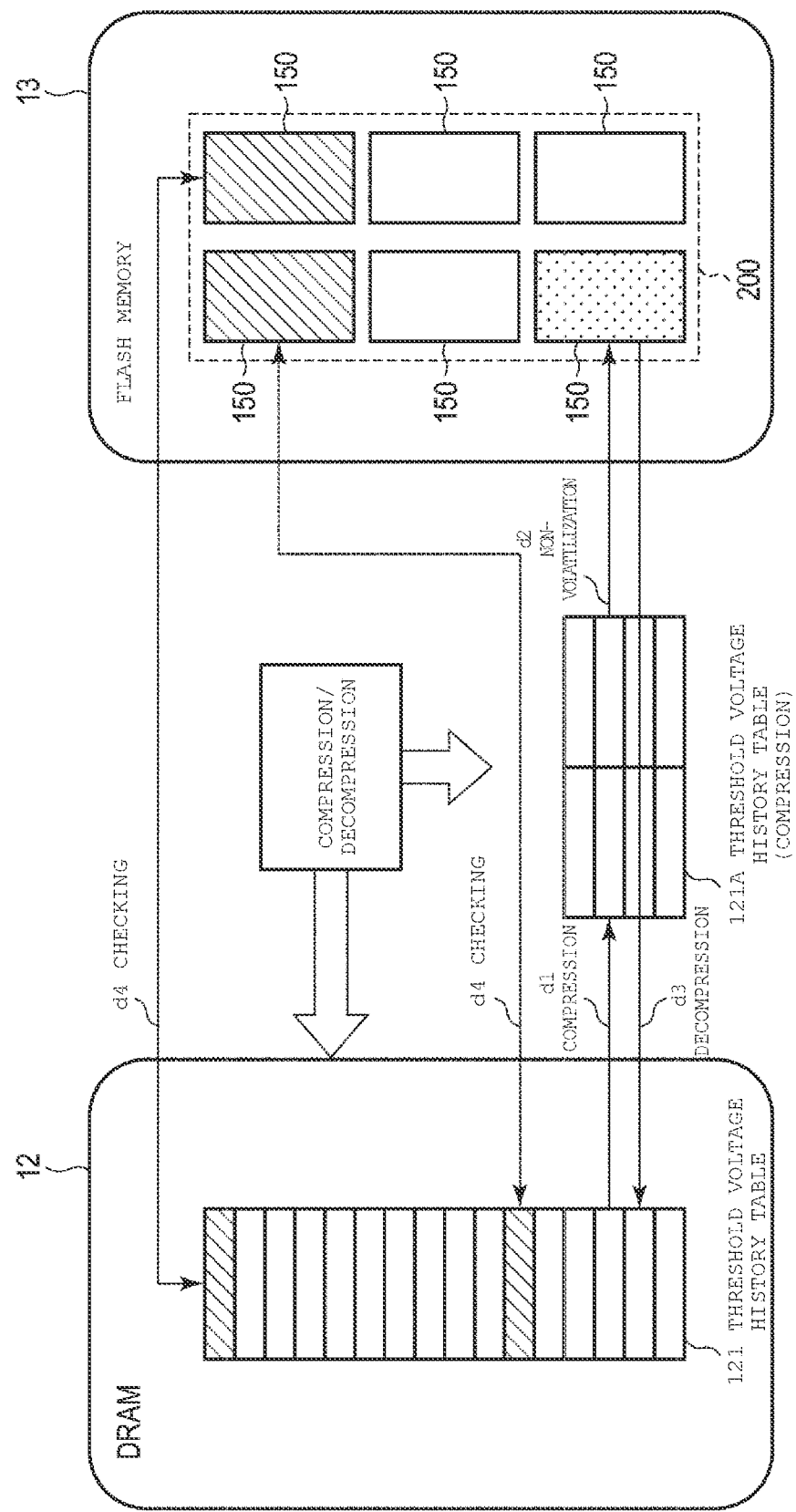
FIG. 12 is a diagram illustrating non-volatilization of a threshold voltage history table of a memory system according to a third embodiment.

FIG. 12 is a diagram illustrating non-volatilization of the threshold voltage history table 121 of the memory system 1 according to the third embodiment.

When the memory system 1 is powered off, the controller 11 compresses the threshold voltage history table 121 using FFT (d1) and stores a compressed threshold voltage history table 121A into the flash memory 13 (d2). FIG. 12 shows a state in which the threshold voltage history table 121 is non-volatilized using one physical block 150, which is less than that in the second comparative example.

On the other hand, when the memory system 1 is powered on, the controller 11 reads the compressed threshold voltage history table 121A from the flash memory 13 and decompresses the table using an Inverse Fast Fourier Transform (IFFT) (d3).

For example, the controller 11 performs threshold voltage tracking on a predetermined number of physical blocks 150 randomly selected from any logical blocks 200 registered in the decompressed threshold voltage history table 121, and compares the threshold voltage obtained by this threshold voltage tracking with the threshold voltage recorded in the now decompressed threshold voltage history table 121 to check whether there is a large difference between them (d4).

When there is no large difference, the controller 11 determines to continue using the threshold voltage history table 121. On the other hand, when there is a large difference, the controller 11 discards the decompressed threshold voltage history table 121 and determines to reconstruct the threshold voltage history table 121 over time with further use. In other words, it determines to return the threshold voltage history table 121 to the state at the start of use of the memory system 1.

Accordingly, the memory system 1 according to the third embodiment can reduce the nonvolatile cost of the threshold voltage history table 121 by compression using FFT. When the elapsed time from a power-off to a power-on of the memory system 1 is long, there is a possibility that the electrical characteristics of the flash memory 13 will have changed noticeably. By checking the difference when the power is turned on, it is possible to cope with such a change in the electrical characteristics of the flash memory 13 caused by the long elapsed time from power-off to power-on of the memory system 1.

Figure 13:
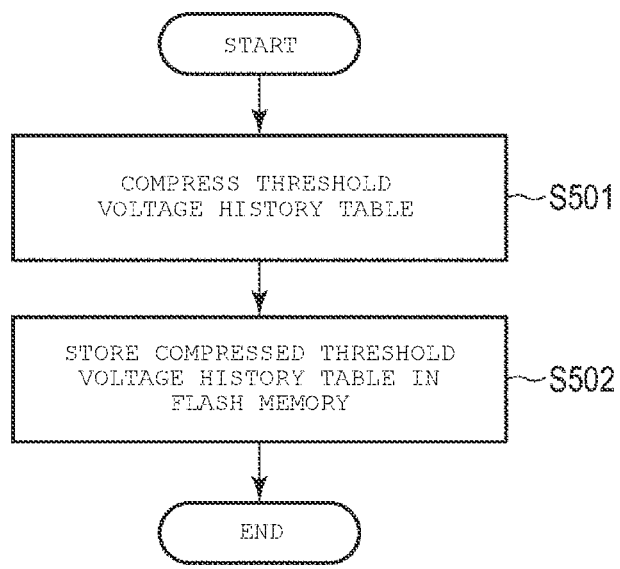
FIG. 13 is a flowchart for correcting a threshold voltage when a memory system according to a third embodiment is powered off.

FIG. 13 is a flowchart showing a procedure for threshold correction when the memory system 1 according to the third embodiment is powered off.

The controller 11 compresses the threshold voltage history table 121 (S501). This compression is preferably a highly efficient lossy compression such as FFT. The controller 11 then stores the compressed threshold voltage history table 121A into the flash memory 13 (S502).

Figure 14:
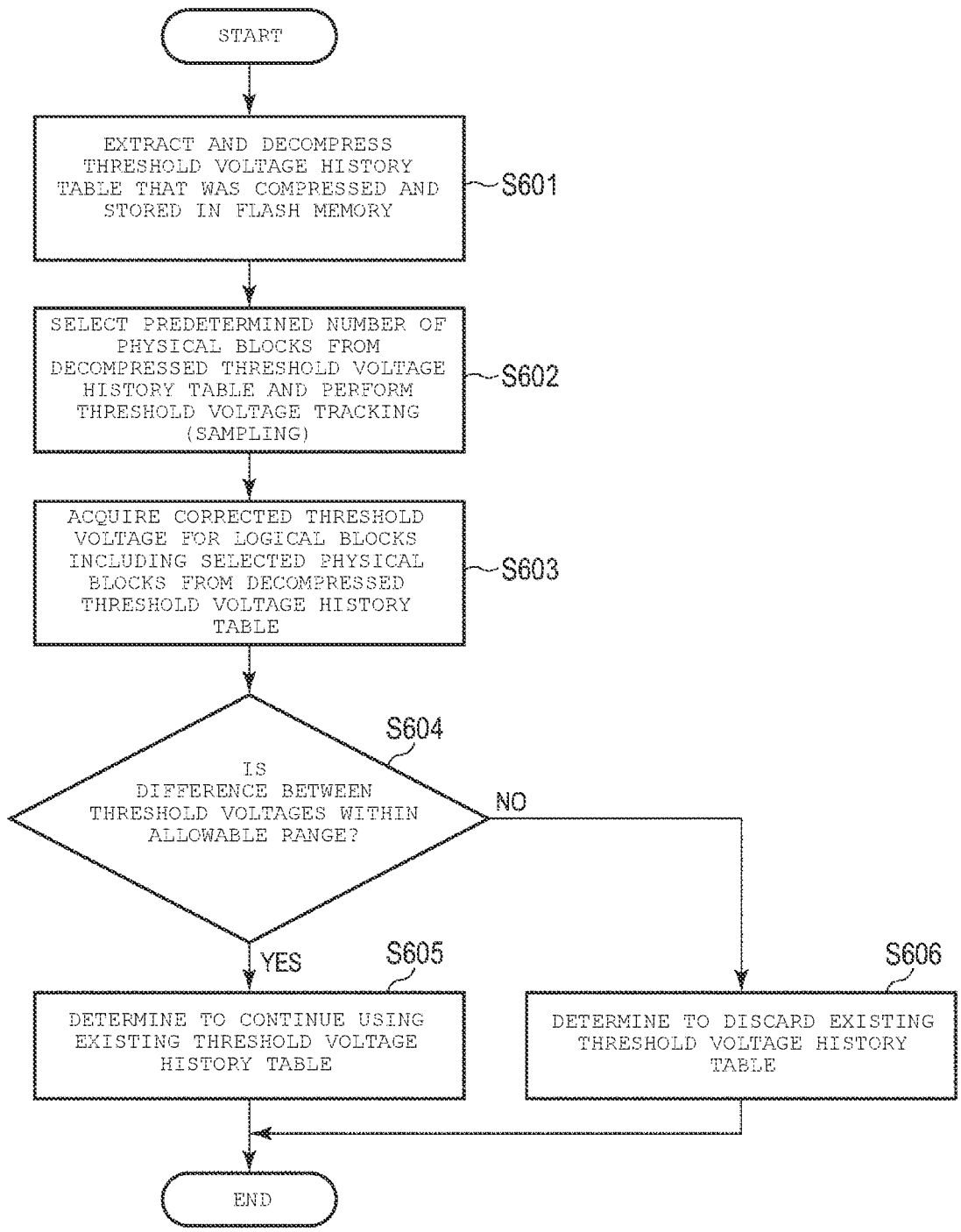

FIG. 14 is a flowchart showing a procedure for threshold correction when the memory system 1 according to the third embodiment is powered on.

The controller 11 extracts and decompresses the threshold voltage history table 121 that was compressed and stored in the flash memory 13 (S601). The controller 11 selects a predetermined number of physical blocks 150 from the decompressed threshold voltage history table 121 and performs threshold voltage tracking (S602). The controller 11 acquires the corrected threshold voltage for the logical block 200 including the selected physical block 150 from the decompressed threshold voltage history table 121 (S603).

The controller 11 determines whether a difference between the threshold voltage obtained by threshold voltage tracking and the corrected threshold voltage obtained from the threshold voltage history table 121 is within an allowable range (S604). When the difference is within the allowable range (S604: YES), the controller 11 determines to continue using the existing threshold voltage history table 121 (S605). On the other hand, when the difference is out of the allowable range (S604: NO), the controller 11 determines to discard the existing threshold voltage history table 121 (S606).

As described above, the memory system 1 according to the third embodiment can perform threshold voltage correction with high accuracy.

It should be noted that the threshold correction method for the memory system 1 described in the third embodiment can be applied to either one, or both in combination, of the threshold correction methods for the memory system 1 as described in the first embodiment and the second embodiment.

When the threshold correction method of the first embodiment and the threshold correction method of the third embodiment are combined, in addition to suppressing the influence of the heterogeneous physical block 150 on the threshold voltage history table 121 by the threshold correction method of the first embodiment, the nonvolatile cost of the threshold voltage history table 121 can be reduced by the threshold correction method of the third embodiment. Furthermore, since it is possible to cope with the change in the electrical characteristics of the flash memory 13 caused by the long elapsed time from power-off to power-on of the memory system 1, threshold voltage correction with higher accuracy is achieved. In addition, since it is expected that the compression ratio is increased by excluding outliers from the threshold voltage history table 121, it is possible to reduce the capacitive cost and performance cost associated with nonvolatile storage of the threshold voltage history table 121 in the flash memory 13 and loading of the threshold voltage history table 121 to the DRAM 12.

Moreover, when the threshold correction method of the second embodiment and the threshold correction method of the third embodiment are combined, in addition to mitigating the change in the electrical characteristics of the flash memory 13 due to the temperature change by the threshold correction method of the second embodiment, the nonvolatile cost of the threshold voltage history table 121 can be reduced by the threshold correction method of the third embodiment. Furthermore, since it is possible to cope with the change in the electrical characteristics of the flash memory 13 caused by the long elapsed time from power-off to power-on of the memory system 1, threshold voltage correction with higher accuracy is achieved. Also, since it becomes possible to cope with temperature changes across power-offs, the possibility of reusing the threshold voltage history table 121 can be increased.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
   a nonvolatile memory including a plurality of physical blocks; and
   a controller configured to control reading and writing of the nonvolatile memory, the controller being further configured to:
   set a plurality of logical blocks, each including physical blocks;
   manage a first table including, for each logical block, a first value indicating a threshold voltage to be used for reading data from the logical block;
   manage a second table including, for each physical block having a corrected threshold voltage that is statistically determined to be an outlier from among corrected threshold voltages for each physical block, a second value indicating the corrected threshold voltage for the physical block together with an identifier of the physical block;
   perform a threshold voltage tracking for identifying a threshold voltage suitable for reading data from a first physical block if a reading of data from a first logical block including the first physical block fails, and then retry the reading of the data from the first logical block using the threshold voltage obtained by the threshold voltage tracking;
   update a threshold voltage for the first logical block including the first physical block in the first table to the threshold voltage obtained by the threshold voltage tracking if an identifier of the first physical block is not recorded in the second table; and
   prohibit updating of the threshold voltage for the first logical block in the first table to the threshold voltage obtained by the threshold voltage tracking if the identifier of the first physical block is recorded in the second table.

2. The memory system according to claim 1, wherein the controller is further configured to:
   update a threshold voltage for the first physical block recorded in the second table to the threshold voltage obtained by the threshold voltage tracking if the identifier of the first physical block is recorded in the second table.

3. The memory system according to claim 2, wherein the controller is further configured to:
   read data from a second physical block using a threshold voltage for the second physical block recorded in the second table if an identifier of the second physical block is recorded in the second table; and
   read the data from the second physical block using a threshold voltage for a second logical block including the second physical block recorded in the first table if the identifier of the second physical block is not recorded in the second table.

4. The memory system according to claim 1, wherein the controller is further configured to:
   read data from a second physical block using a threshold voltage for the second physical block recorded in the second table if an identifier of the second physical block is recorded in the second table; and
   read the data from the second physical block using a threshold voltage for a second logical block including the second physical block recorded in the first table if the identifier of the second physical block is not recorded in the second table.

5. The memory system according to claim 1, further comprising:
   a temperature sensor to measure a temperature of the nonvolatile memory.

6. The memory system according to claim 5, wherein the controller is further configured to:
   manage a third table recording temperature data indicating the temperature of the nonvolatile memory as detected by the temperature sensor at the time of writing data to each logical block.

7. The memory system according to claim 6, wherein the controller is further configured to:
   when reading data from a logical block, acquire a temperature correction value for the threshold voltage based on a difference between a temperature of the nonvolatile memory at the present time and the temperature of the nonvolatile memory at the time of writing data to the logical block as recorded in the third table and use a threshold voltage based on the acquired temperature correction value.

8. The memory system according to claim 7, wherein the controller is further configured to acquire the temperature correction value for the threshold voltage using a predetermined correction table.

9. The memory system according to claim 7, wherein the controller is further configured to acquire the temperature correction value for the threshold voltage by calculation of a model function based on a relationship between the difference of temperature and the temperature correction value.

10. The memory system according to claim 1, wherein the controller is further configured to:
   compress and store the first table in the nonvolatile memory when the memory system is powered off.

11. The memory system according to claim 10, wherein the controller is further configured to:
   read the compressed first table from the nonvolatile memory when the memory system is powered on;
   decompress the compressed first table after reading when the memory system is powered on;
   perform a threshold voltage tracking for identifying a threshold voltage suitable for a second logical block, and compare a first threshold voltage obtained by the threshold voltage tracking with a second threshold voltage for the second logical block recorded in the first table obtained from the decompression;
   determine to use the first table obtained from the decompression if a difference between the first threshold voltage and the second threshold voltage is less than a threshold amount; and
   determine to discard the first table obtained from the decompression if the difference between the first threshold voltage and the second threshold voltage is equal to or greater than the threshold amount.

12. The memory system according to claim 11, wherein the controller is further configured to compress the first table using a lossy compression technique.

13. The memory system according to claim 10, wherein the controller is further configured to compress the first table using a lossy compression technique.

14. A method for controlling a nonvolatile memory including a plurality of physical blocks, the control method comprising:
   setting a plurality of logical blocks, each including physical blocks;
   managing a first table including, for each logical block, a first value indicating a threshold voltage to be used for reading data from the logical block;
   managing a second table including, for each physical block having a corrected threshold voltage that is statistically determined to be an outlier from among corrected threshold voltages for each physical block, a second value indicating the corrected threshold voltage for the physical block together with an identifier of the physical block;
   performing a threshold voltage tracking for identifying a threshold voltage suitable for reading data from a first physical block if a reading of data from a first logical block including the first physical block fails, and then retrying the reading of the data from the first logical block using the threshold voltage obtained by the threshold voltage tracking;
   updating a threshold voltage for the first logical block including the first physical block in the first table to the threshold voltage obtained by the threshold voltage tracking if an identifier of the first physical block is not recorded in the second table; and
   prohibiting updating of the threshold voltage for the first logical block in the first table to the threshold voltage obtained by the threshold voltage tracking if the identifier of the first physical block is recorded in the second table.

15. The method according to claim 14, further comprising:
   updating a threshold voltage for the first physical block recorded in the second table to the threshold voltage obtained by the threshold voltage tracking if the identifier of the first physical block is recorded in the second table.

16. The method according to claim 15, further comprising:
   reading data from a second physical block using a threshold voltage for the second physical block recorded in the second table if an identifier of the second physical block is recorded in the second table; and
   reading the data from the second physical block using a threshold voltage for a second logical block including the second physical block recorded in the first table if the identifier of the second physical block is not recorded in the second table.

17. The method according to claim 14, further comprising:
   managing a third table recording temperature data indicating a temperature of the nonvolatile memory as detected by a temperature sensor at the time of writing data to each logical block.

18. The method according to claim 17, further comprising:
   for reading data from a logical block, acquiring a temperature correction value for the threshold voltage based on a difference between a temperature of the nonvolatile memory at the present time as output by the temperature sensor and the temperature of the nonvolatile memory at the time of writing data to the logical block as recorded in the third table and using a threshold voltage based on the acquired temperature correction value.

19. The method according to claim 14, further comprising:
   compressing and storing the first table in the nonvolatile memory when the memory system is powered off;
   reading the compressed first table from the nonvolatile memory when the memory system is powered on;
   decompressing the compressed first table after reading when the memory system is powered on;
   performing a threshold voltage tracking for identifying a threshold voltage suitable for a second logical block, and comparing a first threshold voltage obtained by the threshold voltage tracking with a second threshold voltage for the second logical block recorded in the first table obtained from the decompression;
   determining to use the first table obtained from the decompression if a difference between the first threshold voltage and the second threshold voltage is less than a threshold amount; and
   determining to discard the first table obtained from the decompression if the difference between the first threshold voltage and the second threshold voltage is equal to or greater than the threshold amount.

20. The method according to claim 19, wherein the first table is compressed using a lossy compression technique.

* * * * *